United States Patent
Gilman et al.

[11] Patent Number: 6,086,735
[45] Date of Patent: Jul. 11, 2000

[54] CONTOURED SPUTTERING TARGET

[75] Inventors: Paul S. Gilman, Suffern, N.Y.; Tetsuya Kojima, Kanagawa-ken, Japan; Chi-Fung Lo, Fort Lee, N.J.; Eiichi Shimizu, Sendai, Japan; Hidemasa Tamura, Sendai, Japan; Norio Yokoyama, Sendai, Japan

[73] Assignee: Praxair S.T. Technology, Inc., North Haven, Conn.

[21] Appl. No.: 09/088,454

[22] Filed: Jun. 1, 1998

[51] Int. Cl.[7] ..................................................... C23C 14/34
[52] U.S. Cl. ............................................................ 204/298.12
[58] Field of Search ........................ 204/192.12, 298.01, 204/298.02, 298.12, 298.18; 428/156

[56] References Cited

U.S. PATENT DOCUMENTS

| | | | |
|---|---|---|---|
| 3,630,881 | 12/1971 | Lester et al. ............................ | 204/298 |
| 3,985,635 | 10/1976 | Adam et al. ............................ | 204/298 |
| 4,551,216 | 11/1985 | Argyo ..................................... | 204/192 |
| 5,336,386 | 8/1994 | Marx et al. ......................... | 204/192.12 |
| 5,538,603 | 7/1996 | Guo .................................... | 204/192.12 |
| 5,658,442 | 8/1997 | Van Gogh et al. ................ | 204/298.12 |
| 5,753,090 | 5/1998 | Obinata .............................. | 204/298.12 |

FOREIGN PATENT DOCUMENTS

| | | |
|---|---|---|
| 0 440 377 A2 | 8/1991 | European Pat. Off. . |
| 150482 | 9/1981 | Germany . |
| 62-037369 | 2/1987 | Japan ................................. 204/298.12 |
| 63-14865 | 1/1988 | Japan . |
| 63-105968 | 5/1988 | Japan . |

*Primary Examiner*—Nam Nguyen
*Assistant Examiner*—Gregg Cantelmo
*Attorney, Agent, or Firm*—Wood, Herron, & Evans, L.L.P.

[57] ABSTRACT

A contoured sputtering target includes a target member of sputtering material having a top surface, a bottom surface and an outer peripheral surface. One or more contoured annular regions are formed on the top surface of the target member that extend radially inwardly from the outer peripheral surface and away from the bottom surface. The target member may further include planar, concave or central recessed regions formed in the top surface that are surrounded by the one or more contoured annular regions. The configuration of the target member reduces generation of contaminating particles from nodules that may form near the outer peripheral surface of the target during a sputtering operation. Methods of forming a contoured sputtering target are also disclosed.

13 Claims, 2 Drawing Sheets

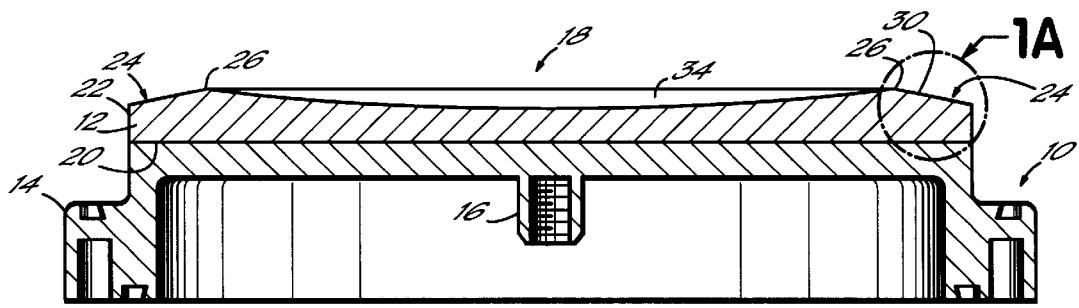
FIG. 1
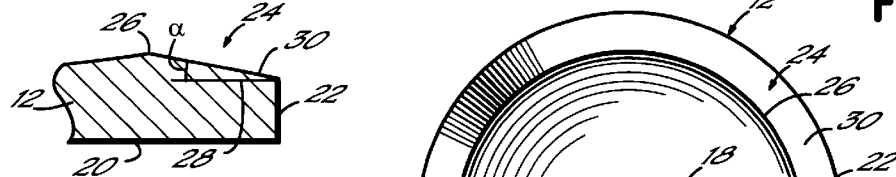
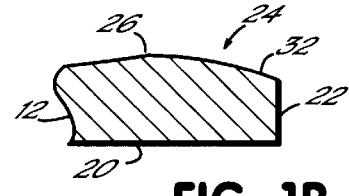
FIG. 1A
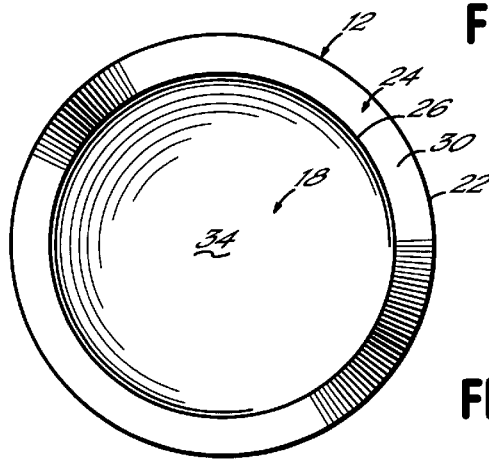
FIG. 2
FIG. 1B
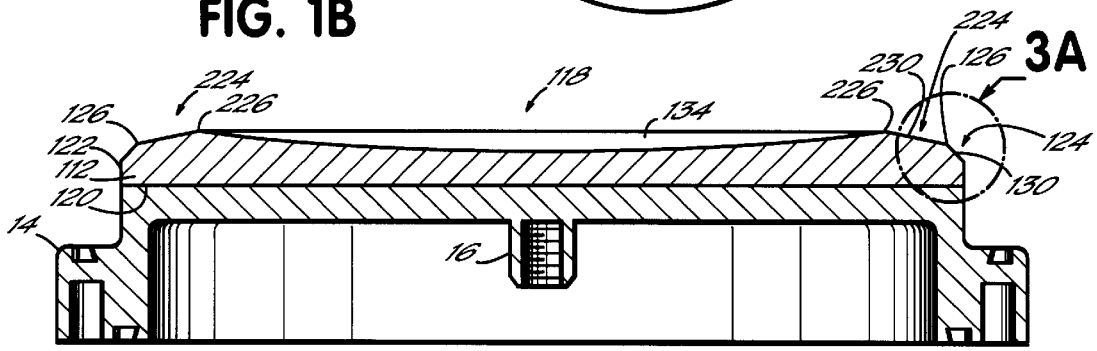
FIG. 3
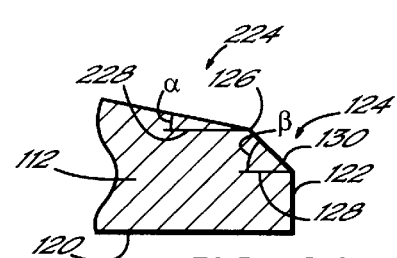
FIG. 3A
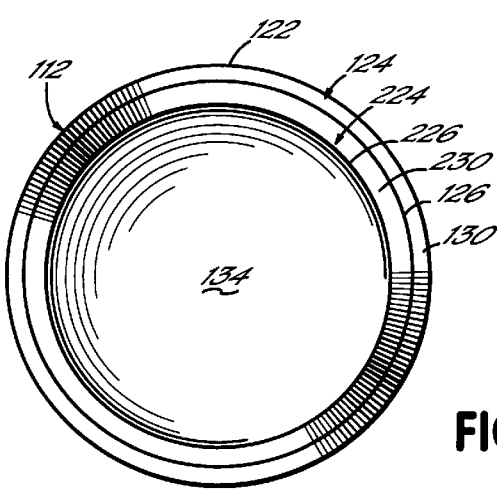
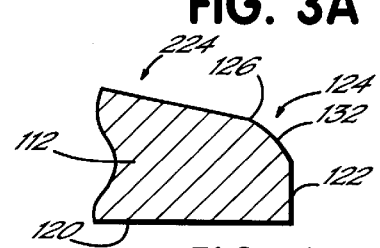
FIG. 3B
FIG. 4

CONTOURED SPUTTERING TARGET

FIELD OF THE INVENTION

The present invention relates generally to sputtering systems and, more particularly, to sputtering targets for use in processing a substrate or wafer in a sputtering system.

BACKGROUND OF THE INVENTION

Sputter coating refers to a process for coating a substrate, such as a semiconductor wafer, within a vacuum processing chamber of a sputtering system. In the sputter coating process, an applied electric field positively biases the wafer relative to an oppositely mounted, negatively biased target made of sputtering material. Once the processing chamber is evacuated, an inert gas is introduced into the chamber at a low pressure, and the applied electric field ionizes the process gas. As a result, positive ions from the gas bombard the target to cause sputtering of the target material onto the wafer in a thin film. A magnet or electromagnet may be located behind the target to provide a magnetic field above the surface of the target facing the wafer to confine the ion "plasma" adjacent the target, and thereby enhance the sputter coating operation.

Sputtering targets are typically formed as a generally circular disk of target material, such as aluminum alloys, gold, silver, copper, titanium, titanium-tungsten or platinum. The disk of target material may be soldered or otherwise bonded to a supporting target backplate to form a replaceable sputtering target assembly. During the sputtering operation, material is sputtered from the top surface of the target and deposited on the wafer. The sputtering material typically erodes unevenly across the width or face of the target exposed to the wafer, with some areas of the target eroding more quickly than other areas.

To overcome this problem, some sputtering equipment employs a variation of the magnetic field, or multiple, non-planar erosion zones on the target, or both, to create a generally uniform sputtering rate across the face of the target. Typically, the outer radial region of the target has been made thicker than the central region of the target. The target may include a concave region formed in the target face or even a hole formed through the center of the target. Sputtering material is eroded from the target until the target is no longer able to provide the desired coating features on the wafer. At that time, the target assembly, consisting of the eroded target and backplate, is replaced by a new target assembly.

In titanium nitride (TiN) sputtering, for example, a titanium sputtering target and backplate assembly is mounted in the vacuum processing chamber with exposed surface of the target facing a wafer. The vacuum chamber is evacuated, and then filled with nitrogen gas that ionizes in the presence of the applied electric field. Positive ions from the plasma process gas bombard the top surface of the target and cause titanium particles to be sputtered toward the wafer. During the sputtering process, the titanium particles chemically react with the nitrogen process gas to form a thin film of titanium nitride on the wafer surface.

An important aspect in sputter coating of wafers is the purity of the film deposited onto the wafer. As the amount of contaminants within the sputter processing chamber increases, the wafer product yield decreases as impurities are formed on the wafer. For example, in titanium nitride sputtering, TiN nodules are known to form on the sputtering face of the target as material from the central portion of the target is sputtered and redeposited on the outer peripheral edge of the target face rather than on the wafer. During the sputtering operation, the TiN nodules have a tendency to flake and generate contaminating particles that adversely affect the purity of the deposited titanium nitride film on the wafer. Since TiN particle generation becomes worse with increasing use of the target, the target must be periodically conditioned to maintain an acceptable device yield.

Target conditioning is achieved by conducting titanium-only sputtering on non-product substrates. The titanium-only sputtering causes the TiN nodules held on the target to be released and deposited on the non-product substrates. While the periodic conditioning prolongs the usable life of the target by removing the contaminating TiN nodules, it requires stoppage of the wafer coating production line and results in downtime of the sputtering system. Thus, notwithstanding known contouring of sputtering targets and modifications to operation of sputtering systems, nodule formation on targets has been a problem, particularly in titanium nitride sputter deposition.

In the past, one-piece sputtering targets have been made that include steep-angled bevels formed adjacent the outer edge of the target to reduce redeposition of TiN particles near the outer surface of the target. In U.S. Pat. No. 5,538,603, for example, bevels are formed adjacent the outer edge of the target that taper at an angle of at least 30° with respect to the planar face of the target, and preferably at a greater angle, i.e., 70°, such that the trajectory of the backscattered atoms will cause the atoms to miss the outer surface of the target altogether. The steep angles of the bevels are also chosen to reduce the thickness of the target adjacent its outer peripheral edge to increase the sputter deposition rate near the tapered target edge. Thus, backscattered TiN particles that collide and redeposit on the target are more likely to be resputtered onto the wafer or substrate. However, the steep tapered targets are single-piece targets that do not encounter the same TiN nodule formation problems associated with sputtering targets mounted to a target backplate.

Accordingly, there is a need for a sputtering target and backplate assembly that reduces generation of contaminating particles from nodules that may form during a sputtering operation. There is also a need for a sputtering target and backplate assembly that requires less periodic conditioning during the life of the target, thereby resulting in less system downtime and a reduction in preventative maintenance.

SUMMARY OF THE INVENTION

The present invention overcomes the foregoing and other shortcomings and drawbacks of the sputtering targets heretofore known. While the invention will be described in connection with certain embodiments, it will be understood that the invention is not limited to these embodiments. On the contrary, the invention includes all alternatives, modifications and equivalents as may be included within the spirit and scope of the present invention.

In accordance with the principles of the present invention, a contoured sputtering target is provided that includes a target member of sputtering material having a top surface or face designed to be exposed to, and confront, the wafer or substrate being coated, a planar bottom surface typically bonded or otherwise joined to a conventional target backplate, and an outer peripheral surface. During a sputtering operation in a processing chamber, sputtered material is ejected from the top surface of the target member and deposited on the substrate in a thin coating or film.

In one embodiment of the present invention, the target member has a contoured annular region formed on the top surface that extends radially inwardly a predetermined distance from the outer peripheral surface and away from the bottom surface. The contoured annular region may include a planar surface, or a radiused surface that extends radially inwardly and away from the bottom surface. The target member may further include a planar, concave or central recessed region formed in the top surface of the target that is surrounded by the contoured annular region.

In an alternative embodiment of the present invention, at least two contoured annular regions may be formed on the top surface of the target member. One of the contoured annular regions is formed radially inwardly from the other contoured annular region. One, or both, of the contoured annular regions may include a planar surface or a radiused surface that extends radially inwardly and away from the bottom surface. The target member may further include a planar, concave or central recessed region formed in the top surface of the target that is surrounded by the contoured annular regions.

The shape or profile of the contoured annular regions on the target member is particularly advantageous to reduce accumulation of redeposition at the target edge. Additionally, the contoured sputtering target of the present invention is particularly profiled to reduce the sputtering or erosion rate of the target member near the outer peripheral surface. As nodules (not shown) form at or near the outer peripheral surface during a sputtering operation, the lower plasma intensity existing near the formed annular regions on the target, and the reduced sputtering rate created by the profile of the target, prevents the nodules from flaking or resputtering during a sputtering operation. The contoured annular regions formed on the target member advantageously stabilize the nodules that may form on the target member to significantly reduce resputtering or flaking of the nodules during a sputtering operation.

The contoured sputtering target of the present invention therefore reduces accumulation of nodules during a sputtering operation, and further reduces generation of contaminating particles from any nodules that may form during the sputtering operation. The contoured sputtering target of the present invention also requires less periodic conditioning during the life of the target, thereby resulting in less system downtime and a reduction in preventative maintenance.

The above features and advantages of the present invention will be better understood with reference to the accompanying figures and detailed description.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the present invention.

FIG. 1 is cross-sectional view along a diameter of a sputtering target in accordance with one embodiment of the present invention;

FIG. 1A is an enlarged view of the encircled area of FIG. 1;

FIG. 1B is a view similar to FIG. 1A showing an alternative embodiment of the present invention;

FIG. 2 is a top plan view of the sputtering target shown in FIG. 1;

FIG. 3 is a view similar to FIG. 1, illustrating a sputtering target in accordance with a second embodiment of the present invention;

FIG. 3A is an enlarged view of the encircled area shown in FIG. 3;

FIG. 3B is a view similar to FIG. 3A showing an alternative embodiment of the present invention;

FIG. 4 is a top plan view of the sputtering target shown in FIG. 3;

DETAILED DESCRIPTION OF THE INVENTION

Figure 5:
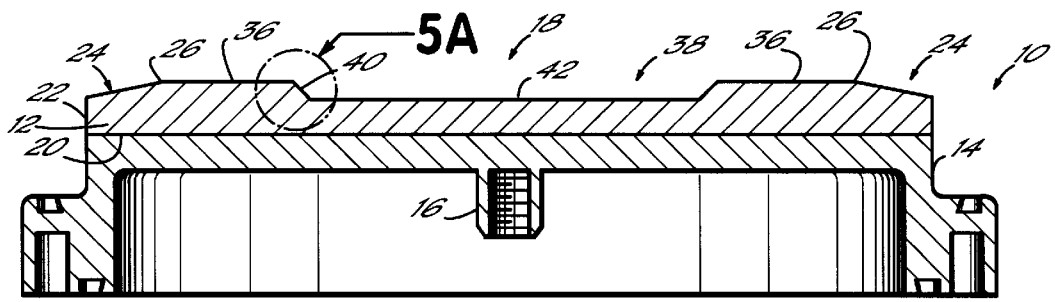
FIG. 5 is a view similar to FIG. 1, illustrating a sputtering target in accordance with a third embodiment of the present invention.
Figure 5A:
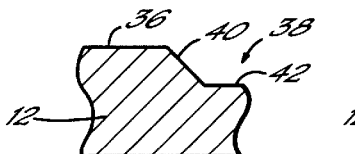
FIG. 5A is an enlarged view of the encircled area shown in FIG. 5.
Figure 5B:
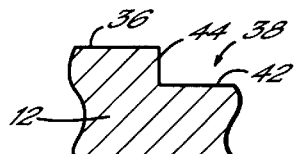
FIG. 5B is a view similar to FIG. 5A showing an alternative embodiment of the present invention.

With reference to the figures, and to FIG. 1 in particular, a contoured sputtering target assembly 10 in accordance with one embodiment of the present invention is shown. Sputtering target assembly 10 includes a target member 12 of sputtering material that may be soldered or otherwise joined to a target backplate 14 for use in a sputtering system (not shown). As those skilled in the art will appreciate, sputtering target assembly 10 is mounted within a vacuum processing chamber (not shown) of the sputtering system (not shown) through fasteners (not shown) and a centrally threaded shaft 16. The sputtering system (not shown) may be of the type shown in U.S. Pat. Nos. 4,909,695 and 5,130,005, both assigned to the assignee of the present invention, which are expressly incorporated herein by reference in their entirety.

Target member 12 may be formed as a generally circular disk of sputtering material, including, but not limited to, titanium, titanium-tungsten, platinum, aluminum alloys, gold, silver, copper or refractory metal silicides. The diameter of target member 12 will vary, typically between ten and fourteen inches depending on the size of the wafer to be sputtered. For example, a ten inch diameter target may be used to sputter coat a six inch diameter wafer, while a twelve inch target may be used to sputter coat an eight inch wafer. While target member 12 will be described in detail herein as a circular disk with a diameter of about ten inches, it will be appreciated by those skilled in the art that other configurations and sizes of target member 12 are possible without departing from the spirit and scope of the present invention.

As best understood with reference to FIGS. 1 and 2, target member 12 has a precisely machined face or top surface 18, a planar bottom surface 20, and an outer peripheral surface 22. Preferably, as shown in the figures, the outer peripheral surface 22 is formed generally perpendicularly to the planar bottom surface 20. During a sputtering operation, target member 12 is mounted within the sputtering process chamber (not shown) with the top surface 18 of the target 12 facing the wafer (not shown). Sputtering material is caused to be ejected from the top surface 18 of target member 12 and deposited onto the wafer (not shown) in a thin film as is well known in the art.

In accordance with one embodiment of the present invention, as best understood with reference to FIGS. 1, 1A and 2, target member 12 is contoured to reduce generation of contaminating particles from nodules (not shown) that may form near the outer peripheral surface 22 of the target during a sputtering operation. Top surface 18 of target member 12 is formed with a contoured annular region 24 that extends radially inwardly from the outer peripheral surface 22 and away from the bottom surface 20. For a ten inch diameter target, for example, the contoured annular region 24 may extend to an annular boundary 26 that lies radially inwardly from the outer peripheral surface 22 in a range between about 0.195 in. and about 0.975 in.

The profile of contoured annular region 24 is particularly chosen to reduce accumulation of redeposition at or near the outer peripheral surface 22. The profile of contoured annular region 24 is also chosen to reduce the sputtering or erosion rate of target member 12 near the outer peripheral surface 22. Thus, as nodules (not shown) form at or near that location, the reduced sputtering rate created by the profile of target member 12 and lower plasma intensity existing near the outer peripheral surface 22 stabilizes the nodules (not shown) and prevents them from flaking and generating contaminating particles within the processing chamber (not shown) that may adversely affect the sputtered film on the substrate or wafer (not shown). While the contour of target member 12 reduces generation of contaminating particles from nodules that may form on target member 12, particularly in titanium nitride sputtering processes, those skilled in the art will appreciate that the present invention is applicable to other sputtering processes as well without departing from the spirit and scope of the present invention.

The contoured annular region 24 is inclined from the outer peripheral surface 22 to the radially inward annular boundary 26. The contoured annular region 24 may be inclined at an angle "α" (FIG. 1A) in a range between about 5° and about 20° relative to a plane 28 (FIG. 1A) that is parallel to the planar bottom surface 20 of the target. In one embodiment of the present invention, contoured annular region 24 may include a planar surface 30 (FIGS. 1, 1A and 2). Alternatively, as shown in FIG. 1B, the contoured annular region 24 may include a radiused surface 32 that extends radially inwardly from the outer peripheral surface 22 to the annular boundary 26 and away from the bottom surface 20 of the target 12. In either embodiment of the contoured annual region 24 as shown in FIGS. 1A and 1B, the configuration of target member 12 reduces generation of contaminating particles from nodules that may form near the outer peripheral surface 22 during a sputtering operation.

In accordance with the principles of the present invention, target member 12 may include a planar region (not shown) formed on the top surface 18 that is surrounded by the contoured annular region 24. The planar region (not shown) is formed generally parallel to the planar bottom surface 20 of target 12. In another embodiment of the present invention, as best understood with reference to FIGS. 1 and 2, the target member 12 may include a substantially concave region 34 formed in the top surface 18 that is surrounded by the contoured annular region 24. The circumferential edge of the concave region 34 may be coincident with the annular boundary 26.

In yet another embodiment of the present invention, as best understood with reference to FIGS. 5, 5A, 5B, 5C and 6, the target member 12 may include a planar region 36 formed in the top surface 18 that is surrounded by the annular region 24. The planar region 36 is generally parallel to the planar bottom surface 20 of the target. The planar region 36 includes a central recessed region 38 formed in the top surface 18 that reduces the thickness of the target member 12 between the planar region 36 and the bottom surface 20 of the target 12 by about 5% to about 20%.

Figure 5C:
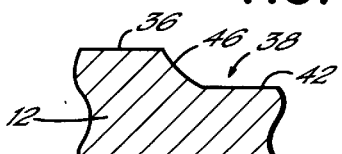
FIG. 5C is a view similar to FIG. 5A showing yet another alternative embodiment of the present invention.
Figure 6:
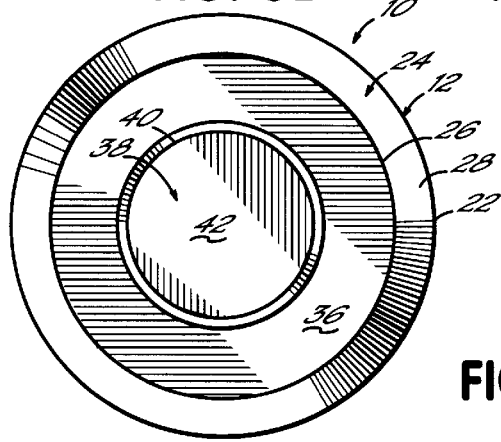
FIG. 6 is a top plan view of the sputtering target shown in FIG. 5.

For a ten inch diameter target, for example, central recessed region 38 is preferably formed in the about 0.195 in. to about 3.10" central portion of the top surface 18. As best understood with reference to FIGS. 5 and 5A, the central recessed region 38 may include a 45° step 40 that extends from the planar region 36 to a recessed planar region 42 formed in the top surface 18. Alternatively, the step transition from the planar region 36 to the recessed planar region 42 may be formed as a 90° step 44 (FIG. 5B) or a radiused step 46 (FIG. 5C). The formation of concave region 34 of FIGS. 1 and 2, and the central recessed regions 38 of FIGS. 5, 5A, 5B, 5C and 6, in combination with the contoured annular region 24, further reduce generation of contaminating particles from nodules that may form near the outer peripheral surface 22 of the target 12 during a sputtering operation.

With reference now to FIGS. 3, 3A, 3B and 4, an alternative embodiment of target member 12 is shown, designated target member 112. Target member 112 has a face or top surface 118, a planar bottom surface 120, and an outer peripheral surface 122 that preferably extends perpendicularly to planar bottom surface 120.

As best understood with reference to FIGS. 3 and 4, top surface 118 of target member 112 is formed with a first contoured annular region 124 that extends radially inwardly from the outer peripheral surface 122 and away from the bottom surface 120. For a ten inch diameter target, for example, the contoured annular region 124 may extend to an annular boundary 126 that lies radially inwardly from the outer peripheral surface 122 in a range between about 0.0195 in. and about 0.195 in.

In this embodiment of the present invention, top surface 118 of target member 112 is also formed with a second contoured annular region 224 that extends radially inwardly from the first annular region 124 and away from the bottom surface 120. For a ten inch diameter target, for example, the second contoured annular region 224 may extend to an annular boundary 226 that lies radially inwardly from the annular boundary 126 in a range between about 0.1755 in. and about 0.995 in.

The contoured annular region 124 is inclined at an angle "β" (FIG. 3A) in a range between about 30° and about 60° relative to a plane 128 (FIG. 3A) that is parallel to the planar bottom surface 120 of the target. In one embodiment of the present invention, contoured annular region 124 includes a planar surface 130 (FIGS. 3 and 3A) that is inclined from the outer peripheral surface 122 to the radially inward annular boundary 126. Alternatively, as shown in FIG. 3B, the contoured annular region 124 may include a radiused surface 132 that extends radially inwardly from the outer peripheral surface 122 to the annular boundary 126 and away from the bottom surface 120.

The contoured annular region 224 is inclined at an angle "α" (FIG. 3A) in a range between about 5° and about 20° relative to a plane 228 (FIG. 3A) that is parallel to the planar bottom surface 120 of target 112. In one embodiment of the present invention, contoured annular region 224 may include a planar surface 230 (FIGS. 3 and 4) that is inclined from the contoured annular region 124 to the radially inward annular boundary 226. Alternatively, the contoured annular region 224 may include a radiused surface (not shown) that extends radially inwardly from the annular boundary 126 to the annular boundary 226 and away from the bottom surface 120. In each embodiment of the contoured annual regions 124 and 224 as shown in FIGS. 3A and 3B, the configuration of target member 112 reduces generation of contaminating particles from nodules that may form near the outer peripheral surface 122 of the target 112 during a sputtering operation.

In accordance with the principles of the present invention, target member 112 may include a planar region (not shown) formed on the top surface 118 that is surrounded by the annular regions 124 and 224. The planar region (not shown) is formed generally parallel to the bottom surface 120. In another embodiment of the present invention, as best understood with reference to FIGS. 3 and 4, the target member 112 may include a substantially concave region 134 formed in the top surface 118 that is surrounded by the annular regions 124 and 224. In yet another embodiment of the present invention, as best understood with reference to FIGS. 7 and 8, the target member 112 may include a planar region 136 formed in the top surface 118 that is surrounded by the annular regions 124 and 224. Planar region 136 is formed generally parallel to the bottom surface 120. The planar region 136 includes a central recessed region 138 formed in the top surface 118 that is similar to the central recess region 38 described in detail above with reference to FIGS. 5, 5A, 5B and 5C.

Figure 7:
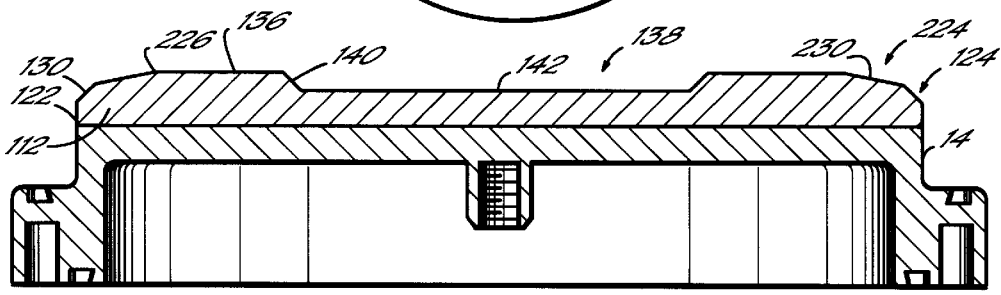
FIG. 7 is a view similar to FIG. 1, illustrating a sputtering target in accordance with a fourth embodiment of the present invention.
Figure 8:
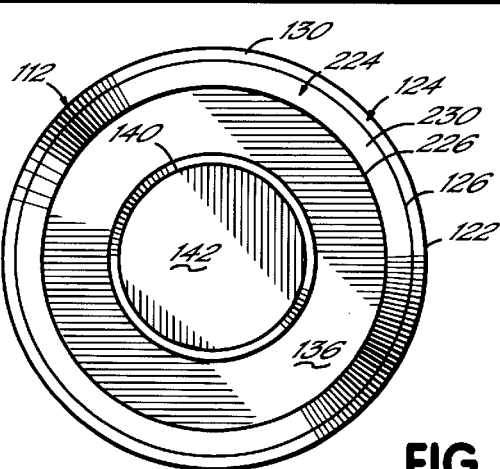
FIG. 8 is a top plan view of the sputtering target shown in FIG. 7.

As best understood with reference to FIG. 7, the central recessed region 138 may include a 45° step 140 that extends from the planar region 136 to a recessed planar region 142 formed in the top surface 118. Alternatively, the step transition from the planar region 136 to the recessed planar region 142 may be formed as a 90° step (not shown) or a radiused step (not shown) as described in detail above with reference to FIGS. 5B and 5C. The formation of the concave region 134 of FIGS. 3 and 4, and the central recessed regions 138 of FIGS. 7 and 8, further reduce generation of contaminating particles from nodules that may form near the outer peripheral surface 122 of the target 112 during a sputtering operation.

From the above disclosure of the general principles of the present invention and the preceding detailed description of preferred embodiments, those skilled in the art will readily comprehend the various modifications to which the present invention is susceptible. For example, the central recessed regions 38 and 138 may be replaced with central holes (not shown) extending through the thickness of the target member. Moreover, it will be appreciated that for sputtering targets of greater or lesser diameter than the ten inch diameter target member 12 discussed herein, the dimensions set forth above with respect to the radially inward extent of contoured annular regions 24, 124 and 224 will be increased or decreased proportionally. The invention in its broader aspects is therefore not limited to the specific details and illustrative example shown and described. Accordingly, departures may be made from such details without departing from the spirit or scope of Applicants general inventive concept. Therefore, Applicants desire to be limited only by the scope of the following claims and equivalents thereof:

Having described the invention, we claim:

1. A contoured sputtering target for processing a substrate in a sputtering system, comprising:

a target backplate;

a target member of sputtering material mounted to said backplate and having a top surface, a bottom surface and an outer peripheral surface, said sputtering material being ejected from said top surface and onto the substrate during a sputtering operation, said target member including a first contoured annular region formed on said top surface extending continuously radially inwardly a predetermined distance from a juncture with said outer peripheral surface and away from said bottom surface at an angle in a range between about 30° and about 60° relative to a plane parallel to said bottom surface, said target member further including a second contoured annular region formed on said top surface extending continuously radially inwardly a predetermined distance from a juncture with said first annular region and away from said bottom surface at an angle in a range between about 5° and about 20° relative to a plane parallel to said bottom surface.

2. The sputtering target of claim 1 wherein said target member includes a substantially concave region formed in said top surface surrounded by said first and second contoured annular regions.

3. The sputtering target of claim 1 wherein said target member includes a central recessed region formed in said top surface surrounded by said first and second contoured annular regions.

4. The sputtering target of claim 1 wherein said target member includes a planar region formed on said top surface surrounded by said first and second contoured annular regions.

5. The sputtering target of claim 1 wherein said first contoured annular region has a planar surface.

6. The sputtering target of claim 1 wherein said first contoured annular region extends radially inwardly from said outer peripheral surface in a range between about 0.0195 in. and about 0.195 in.

7. The sputtering target of claim 1 wherein said second contoured annular region has a planar surface.

8. The sputtering target of claim 1 wherein said second contoured annular region extends radially inwardly from said first contoured annular region in a range between about 0.1755 in. and about 0.955 in.

9. The sputtering target of claim 1 wherein said outer peripheral surface is substantially perpendicular to said bottom surface.

10. A method of manufacturing a contoured sputtering target, comprising:

forming a target member of sputtering material having a top surface, a bottom surface and an outer peripheral surface;

forming a first contoured annular region on said top surface extending continuously radially inwardly from a juncture with said outer peripheral surface and away from said bottom surface at an angle in a range between about 30° and about 60° relative to a plane parallel to said bottom surface; and forming a second contoured annular region on said top surface extending continuously radially inwardly from a juncture with said first contoured annular region and away from said bottom surface at an angle in a range between about 5° and about 20° relative to a plane parallel to said bottom surface.

11. The method of claim 10 further comprising forming a planar surface on said first contoured annular region.

12. The method of claim 10 further comprising forming a planar surface on said second contoured annular region.

13. A method of sputter coating a wafer comprising the steps of:

installing in a sputtering system process chamber a target member of sputtering material having a top surface, a bottom surface and an outer peripheral surface, said sputtering material being ejected from said top surface and onto the wafer during a sputtering operation, said target member having a first contoured annular region formed on said top surface extending continuously radially inwardly a predetermined distance from a juncture with said outer peripheral surface and away from said bottom surface at an angle in a range between about 30° and about 60° relative to a plane parallel to said bottom surface, said target member further having a second contoured annular region formed on said top surface extending continuously radially inwardly a predetermined distance from a juncture with said first annular region and away from said bottom surface at an angle in a range between about 5° and about 20° relative to a plane parallel to said bottom surface;

creating a vacuum in said processing chamber;

introducing an inert gas into said processing chamber; and applying a voltage potential between the wafer and said target member whereby sputtered material is deposited onto the wafer.

* * * * *